United States Patent [19]

Chang

[11] Patent Number: 4,817,051

[45] Date of Patent: Mar. 28, 1989

[54] EXPANDABLE MULTI-PORT RANDOM ACCESS MEMORY

[75] Inventor: Daniel Chang, Sunnyvale, Calif.

[73] Assignee: Fairchild Semiconductor Corporation, Cupertino, Calif.

[21] Appl. No.: 69,155

[22] Filed: Jul. 2, 1987

[51] Int. Cl.[4] .............................................. G11C 8/00
[52] U.S. Cl. .................................... 365/154; 365/230
[58] Field of Search ............... 365/154, 177, 189, 205, 365/230, 179

[56] References Cited

U.S. PATENT DOCUMENTS 4,125,877 11/1978 Reinert ................................. 365/195
4,412,312 10/1983 Berger et al. ........................ 365/230

Primary Examiner—James W. Moffitt
Attorney, Agent, or Firm—Burns, Doane, Swecker & Mathis

[57] ABSTRACT

A bipolar RAM circuit that can be expanded to provide as many ports as desired has separate read and write ports. Each read port comprises two transistors whose collectors are respectively connected to bit lines for that port and whose emitters are commonly connected to a word line. Each write port comprises a pair of transistors whose collectors are respectively connected to the data latch within the cell, whose bases are tied to a pair of bit lines and whose emitters are connected in common to a word line for that write port. To write information into the cell, current is either steered from a standby current path to a desired word line, or a larger write current is steered to the selected word line, causing the data in the cell to be determined by the differential voltage present on the bit lines for the write port.

10 Claims, 4 Drawing Sheets

EXPANDABLE MULTI-PORT RANDOM ACCESS MEMORY

BACKGROUND OF THE INVENTION

The present invention is directed to memory circuits, and more particularly to random access memories having multiple read and/or write ports.

Recently, random access memories (RAMs) having multiple input and/or output ports for each cell in the memory have gained increasing interest. The various ports can be simultaneously accessed, thereby enabling data flow to multiple locations to be accomplished at a faster rate. Because of the increased operating speed that multiple port RAMs provide, they are highly desirable for use in computational intensive systems, such as signal and image processing, work stations and computer-aided design (CAD) terminals. In addition to the increased throughput multi-port RAMs provide in such systems, they allow the overall design of the system to be simplified.

In the past, multiple port RAMs have been implemented with CMOS technology. See, for example, Dedrick, "Multi-Port Register File Streamlines Signal Processing," EDN, Nov. 15, 1984, pp. 301-306 and Dedrick, "Multi-Port Register File Simplifies and Speeds Digital Signal Processing," Electronic Design, May 17, 1984, pp. 213-222. Generally speaking, the design principles of CMOS technology facilitate the implementation of multi-port RAMs. Furthermore, CMOS technology is desirable because of its low power requirements.

However, one limitation associated with CMOS memory circuits is the slower operating times that they exhibit, relative to memory circuits implemented with bipolar technology. Generally, the operating speed of a bipolar RAM is at least an order of magnitude greater than the speed of a CMOS RAM. For certain applications requiring high speed access to the memory, a bipolar multiple port RAM circuit would be desirable. To date, however, RAMs that have been implemented in bipolar technology have provided a limited number of input and output ports. Most offer only single or dual ports. A 5-port register file using ECL technology is described in Rose, "A Sub 10 ns Bipolar 5 Port 1 kbit Register File", 1986 Bipolar Circuits and Technology Meeting, IEEE 1986, pp. 95-95. While offering more than two ports, the approach described in this paper requires a relatively high component count per layout area and consumes a significant amount of power.

BRIEF STATEMENT OF THE INVENTION

Accordingly, it is an objective of the present invention to provide a novel bipolar RAM circuit that can be expanded to provide as many read and write ports as desired by the system designer while offering low packing density and power constraints. In accordance with this objective, the present invention provides a RAM cell circuit having separate read and write ports. A read port comprises two transistors whose collectors are respectively connected to bit lines for that port and whose emitters are commonly connected to a word line. Every additional read port would be constituted by an additional pair of transistors, a pair of bit lines and a word line. Each write port comprises a pair of transistors whose collectors are respectively connected to the data latch within the cell, whose bases are tied to a pair of bit lines and whose emitters are connected in common to a word line for that write port. To write information into the cell, current is steered to a selected word line, causing the data in the cell to be determined by the differential voltage present on the bit lines for the write port. In a relatively simple implementation of the invention, the current that is steered to the work line can be the standby current of the latch.

Further features of the invention, and the manner in which they function to accomplish the foregoing objectives are explained in detail hereinafter with reference to preferred embodiments of the invention illustrated in the accompanying drawings.

DESCRIPTION OF THE ILLUSTRATED EMBODIMENTS

The basic construction of a random access memory comprises a matrix of individual memory cells arranged in plural rows and columns. All of the memory cells in a column of the circuit share one or more pairs of bit lines through which the data is written into and/or read from the cell. The particular cell in a column that is to receive or provide data on the bit lines is addressed by means of word lines that are respectively associated with the rows of cells in the matrix.

Figure 1:
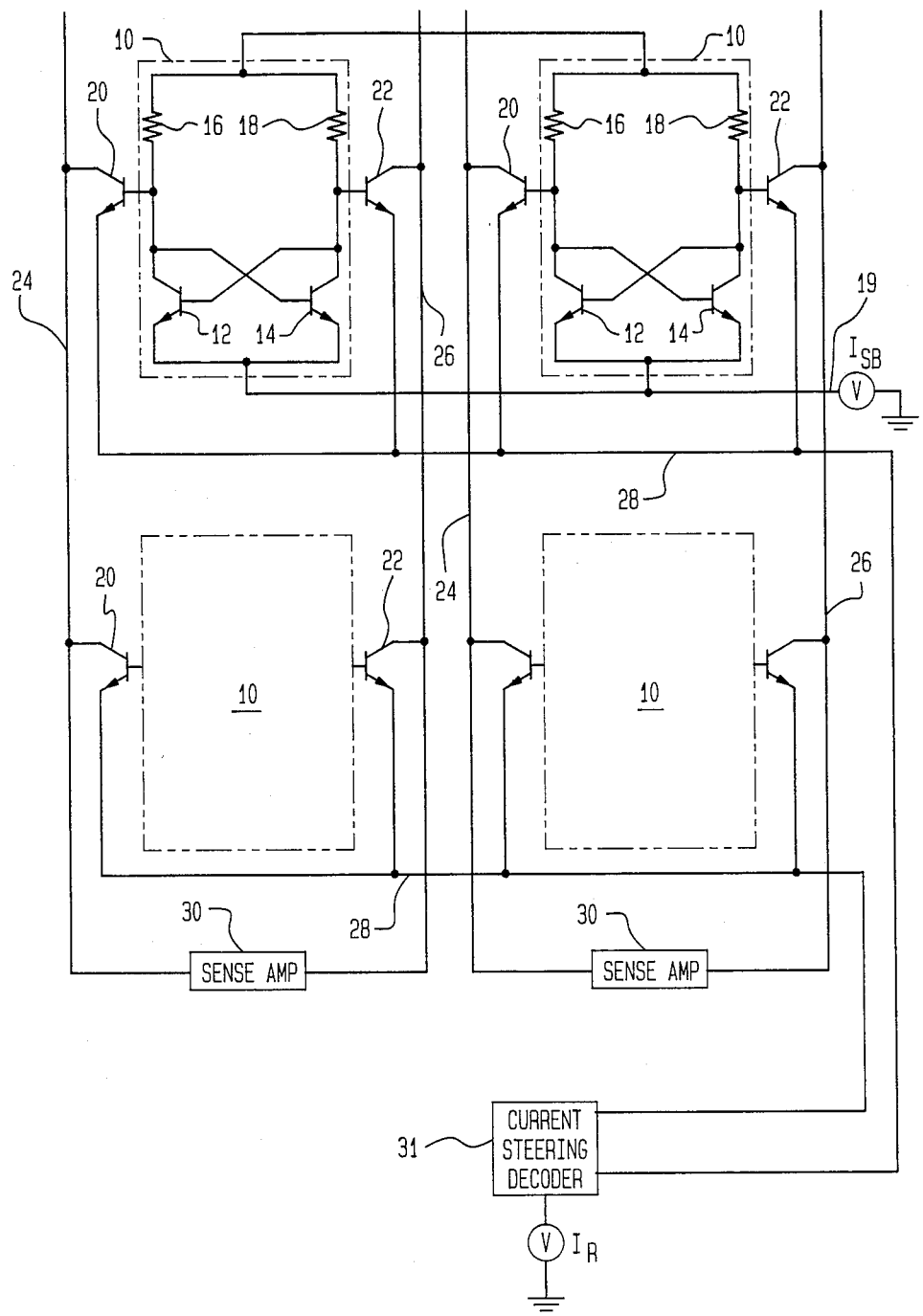
FIG. 1 is a schematic circuit diagram of a 2×2 memory and particularly illustrating cells having read ports constructed in accordance with the present invention.

One bit of data is stored in each cell by means of a latch. Referring to FIG. 1, which illustrates the reading and storage portions of a 2×2 memory circuit, each latch 10 is comprised of a cross-coupled pair of npn bipolar transistors 12 and 14. The collector of the transistors are connected to a constant voltage source VC by means of respective loads. For example, each load might comprise a resistor 16 or 18 as shown in FIG. 1. Alternatively, the loads could comprise diodes, pnp transistors or some combination of these elements, as conventionally employed in single port RAM cells. The collector of each transistor is also connected to the base of the other transistor, to provide the cross-coupled arrangement. The emitter of the two transistors are connected in common to a standby current source $I_{SB}$ by means of a standby current word line 19. The bit of data, i.e. binary one or zero, that is stored in the cell is determined by the relative states of conductivity of the cross-coupled transistors 12 and 14.

A read port for accessing the information stored in the latch is comprised of a pair of npn transistors 20 and 22 whose bases are respectively connected to the collectors of the crosscoupled transistors 12, 14 in the latch. The collectors of these transistors 20, 22 are respectively connected to two bit lines 24 and 26 associated with the read port. A word line 28 for the read port is connected to the emitters of the read port transistors 20 and 22. Each pair of bit lines 24 and 26 is connected to a respective sense amplifier 30.

In operation, the non-selected word lines of the various cells normally conduct a very low current, causing them to be held in a high voltage state. Consequently, very little current flows through the read port transistors 20 and 22. When it is desired to read the information stored in a row of the memory, the word line 28 for that row conducts a read current $I_R$ under the control of a 1-of-N current steering decoder 31, thereby rendering the read port transistors 20 and 22 for that row conductive. The sensing amplifiers 30 detect the differential presence of the read currents on their associated pairs of bit lines 24 and 26 to determine the binary value of the data stored in the respective addressed cells.

Figure 2:
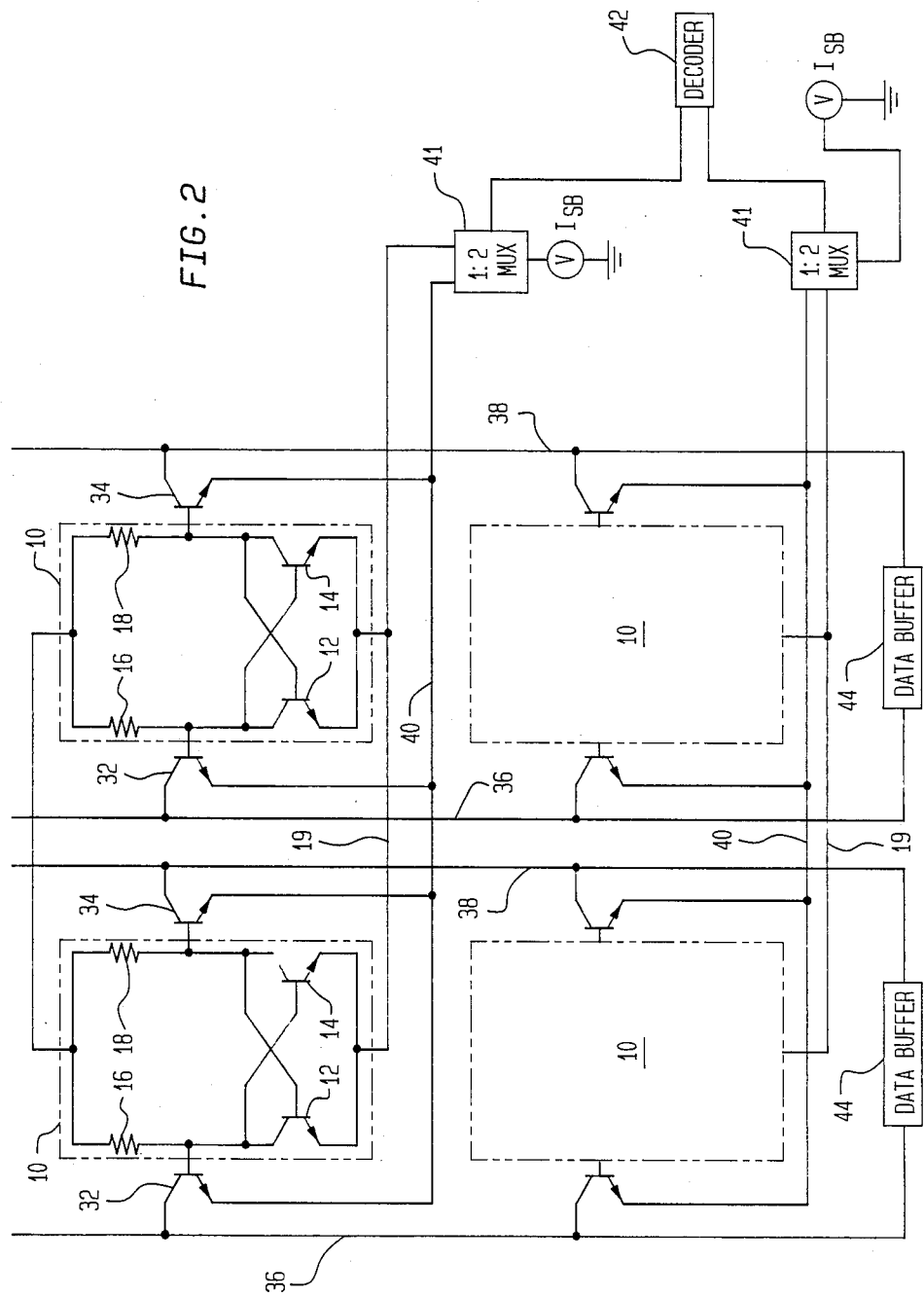
FIG. 2 is a schematic circuit diagram of the 2×2 memory illustrating cells having write ports in accordance with the present invention.

Referring now to FIG. 2, a write port for each cell is illustrated. Each write port comprises a pair of transistors 32 and 34 whose collectors are respectively connected to the collectors of the cross-coupled transistors 12 and 14 in the latch. The bases of the write port transistors are connected to respective bit lines 36 and 38 for the write port. The emitters of the transistors are connected in common to a word line 40.

To write a bit of data into a cell, current is steered from the standby current word line 19 to the write word line 40 for the cell by means of a current steering multiplexer 41 and decoder 42. Basically, the decoder 42 determines which row of cells is addressed, and the multiplexer 41 steers the write current, e.g., standby current, into the appropriate word line for the addressed row. When this current steering operation occurs, the write port transistors 32 and 34 determine the state of the latch, in accordance with the differential voltage presented on the bit lines 36 and 38 by means of a data buffer 44.

As an alternative to switching the current from the standby current word line 19 to the write word line 40, it is feasible to maintain a small, constant standby current on the word line 19 and to make the write current for the word line 40 larger than the standby current with a current steering configuration similar to that of the read port shown in FIG. 1. As a result, the larger write current will override the standby current. This operation will cause the write transistors 32 and 34 to force the latch into the desired state determined by the data in the buffer 44. This alternative approach is beneficial in that it saves power.

Figure 3:
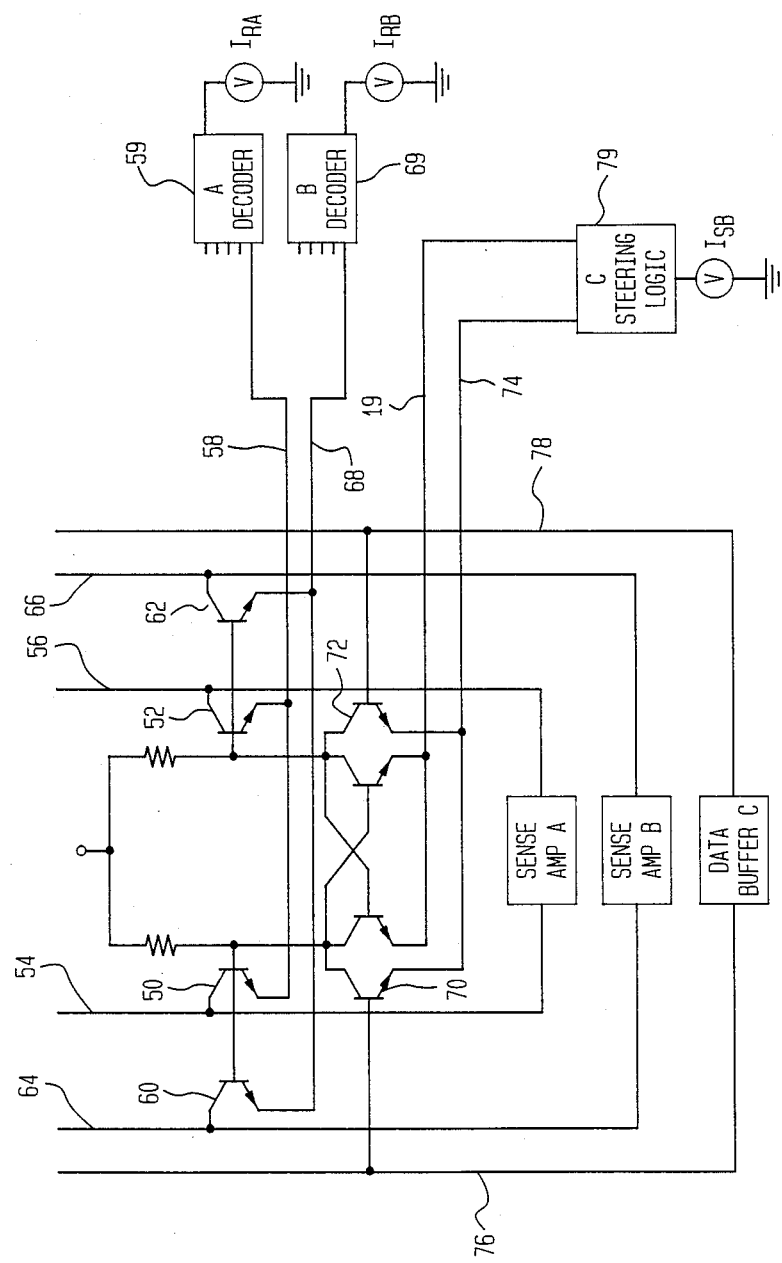
FIG. 3 is a schematic circuit diagram illustrating a memory cell having two read ports and one write port.
Figure 4:
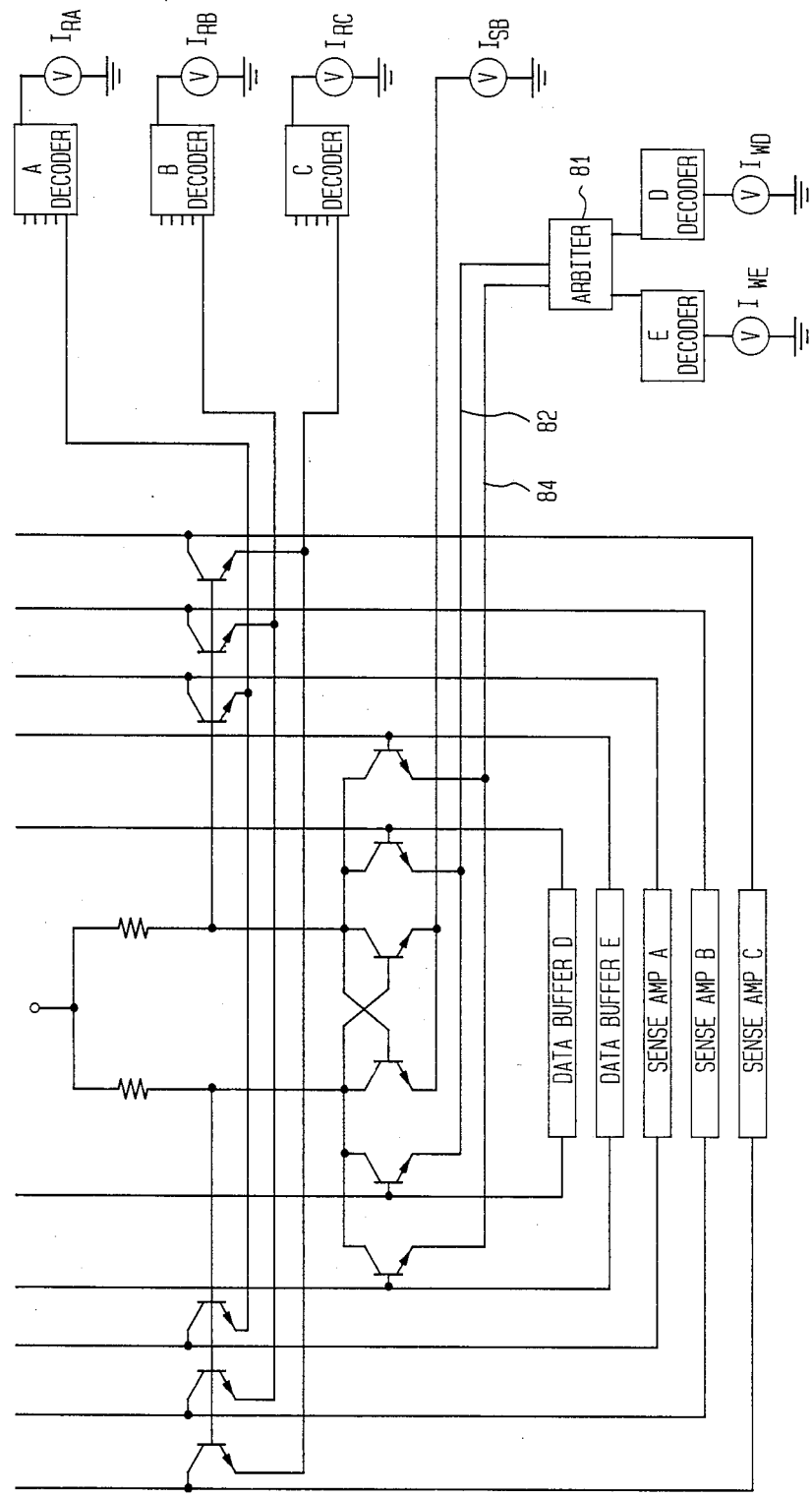
FIG. 4 is a schematic circuit diagram of an expanded memory cell having three read ports and two write ports.

FIGS. 3 and 4 illustrate examples of the manner in which the memory circuit of the present invention can be configured to provide as many read and write ports as desired. Due to the structural arrangement of the memory cell, the base current through the transistors of the read ports, i.e. transistors 20 and 22 in FIG. 1, is very small. This small current will not adversely detract from the collector-emitter current through the latch transistors 12 and 14 and therefore the cell can be expanded to multiple ports. Referring to FIG. 3, a memory cell having two read ports and one write port is shown. One read port, designated the A port, comprises a first pair of read transistors 50 and 52 connected between a pair of bit lines 54, 56 and a read word line 58. The bit lines 54, 56 provide data from the latch 10 to a sense amplifier A when the word line 58 is pulled low by a decoder 59 to conduct current through the transistors 50 and 52.

The second read port, designated the B port, similarly comprises a second pair of read transistors 60 and 62 connected between a second pair of bit lines 64, 66 and a second read word line 68. The bit lines 64 and 66 provide the same data from the latch 10 to a second sense amplifier B when the word line 68 is pulled low by a decoder 69. The A and B read ports can be accessed simultaneously by pulling both of their word lines 58 and 68 low at the same time to provide the same bit of data to two different destinations. Furthermore, the separate word lines enable one word, i.e. one row of cells, to be read at port A and a different word to be read at port B without ambiguity.

The write port, designated the C port, comprises a pair of write transistors 70 and 72 connecting a write word line 74 to the latch 10. The bases of the write transistors 70 and 72 are connected to the bit lines 76 and 78 for the write port. When the write word line 74 is pulled low by steering current from the standby line 19 into it through the decoder 79, data from a data buffer C is written into the latch 10 through the bit lines 76, 78 and the transistors 70 and 72.

This cell structure can be further expanded to provide additional read and write ports. For example, a cell having three read ports A, B, C and two write ports D, E is illustrated in FIG. 4. The read ports respectively provide data from the latch 10 to sense amplifiers A, B and C, and can all be accessed simultaneously. Similarly, the write ports respectively enable data to be written into the latch 10 of the cell from either of the data buffers D or E.

Unlike the read ports, multiple write ports should not be allowed to access the latch 10 at the same time. Otherwise, data errors could result. To avoid the possibility of errors, suitable conventional arbitration or contention logic 81 can be included for the write word line decoding operation. This logic would prevent two different write word lines in the same row, for example word lines 82 and 84 in the circuit of FIG. 4, from being pulled low at the same time. If desired, however, different write ports in different rows of the memory can be used at the same time. For example, data can be written into the cells in one row of the memory through port D while data is being written into the cells in another row of the memory through port E to increase the utilization speed of the memory.

From the foregoing it can be seen that the present invention provides a memory cell structure that enables the memory to be configured with as many read and write ports as desired, using currently available bipolar technology. Each port, whether read or write, consists of a pair of bit lines, a pair of transistors for transferring data between the respective bit lines and the data latch of the cell, and a word line for controlling the actuation of those transistors. All of the ports of the memory can be accessed asynchronously. Further, each of the read ports of a cell can be accessed simultaneously to provide the same bit of data to multiple destinations.

To write data into the cell, standby current or a write current is steered into the word line of one of the write ports to drive the latch into the binary state determined by the data on the write bit lines for that port. There is no problem of contention should one read port and one write port address the same word (row of cells) in the memory. Since the read and write ports are separate, the writing of data into a cell will not be disturbed by a simultaneous read operation. However, the data which is read from the cell might not be valid until after the write operation has been performed.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A bipolar random-access memory that is expandable to provide a desired number of read and write ports, comprising:
   a multiplicity of memory cells arranged in a plurality of rows and columns, each memory cell including
   a latch circuit having a pair of crosscoupled bipolar transistors whose collectors are connected to a substantially constant voltage by means of respective loads and whose emitters are connected in common to a standby current line,
   at least one read port, said read port having a pair of bipolar sense transistors whose bases are respectively connected to the collectors of the transistors in said latch circuit, a pair of bit lines respectively connected to the collectors of said sense transistors, and a read word line connected to the emitters of said sense transistors,
   at least one write port, said write port having a pair of bipolar write transistors whose collectors are respectively connected to the collectors of the transistors in said latch circuit, a pair of bit lines respectively connected to the bases of said write transistors, and a write word line connected to the emitters of said write transistors;
   a read decoding circuit for selectively steering current into a read word line associated with the memory cells in a row of the memory; and
   a write decoding circuit for selectively steering current to a write word line associated with the memory cells in a row of the memory.

2. The memory of claim 1 wherein said memory cells each includes at least first and second read ports, and said read decoding circuit includes a first decoder connected to the read word line of said first read port and a second decoder connected to the write word line of said second read port.

3. The memory circuit of claim 2 wherein all of the first read ports in the memory cells of a row of the memory have their sense transistors connected to a common first read word line and all of the second read ports in said memory cells of said row have their sense transistors connected to a common second read word line.

4. The memory circuit of claim 2 wherein all of the first write ports in the memory cells of a row of the memory have their write transistors connected to a common first write word line and all of the second write ports in said memory cells of said row have their write transistors connected to a common second write word line.

5. The memory of claim 1 wherein said memory cells each includes at least first and second write ports, and said write decoding circuit includes a first decoder connected to the write word line of said first write port and a second decoder connected to the write word line of said second write port.

6. The memory of claim 5 further including contention logic for inhibiting currents from being steered to more than one of said write word lines of a row at a time.

7. The memory circuit of claim 1 wherein said write decoding circuit steers current from the standby current line to said write word line.

8. A memory cell circuit for an expandable port random access memory, comprising:
   a latch circuit having a pair of cross-coupled bipolar transistors;
   at least one read port, said read port having a pair of bipolar sense transistors whose bases are respectively connected to the transistors in said latch circuit, a pair of bit lines respectively connected to the collectors of said sense transistors, and a read word line connected to the emitters of said sense transistors,
   at least one write port, said write port having a pair of bipolar write transistors whose collectors are respectively connected to the transistors in said latch circuit, a pair of bit lines respectively connected to the bases of said write transistors, and a write word line connected to the emitters of said write transistors.

9. A memory cell circuit for an expandable port random access memory, comprising:
   a latch circuit having a pair of cross-coupled bipolar transistors;
   a first read port having a first pair of bipolar transistors whose bases are respectively connected to the transistors in said latch circuit, a first pair of bit lines respectively connected to the collectors of said first pair of transistors, and a first word line connected to the emitters of said first pair of transistors,
   a second read port having a second pair of bipolar transistors whose bases are respectively connected to the transistors in said latch circuit, a second pair of bit lines respectively connected to the collectors of said second pair of transistors, and a second word line connected to the emitters of said second pair of transistors; and
   at least one write port having a third pair of bipolar transistors whose collectors are respectively connected to the transistors in said latch circuit, a third pair of bit lines respectively connected to the bases of said third pair of transistors, and a third word line connected to the emitters of said third pair of transistors.

10. A memory cell circuit for an expandable port random access memory, comprising:
    a latch circuit having a pair of cross-coupled bipolar transistors;
    at least one read port having a first pair of bipolar transistors whose bases are respectively connected to the transistors in said latch circuit, a first pair of bit lines respectively connected to the collectors of said first pair of transistors, and a first word line connected to the emitters of said first pair of transistors,
    a first write port having a second pair of bipolar transistors whose collectors are respectively connected to the transistors in said latch circuit, a second pair of bit lines respectively connected to the bases of said second pair of transistors, and a second word line connected to the emitters of said second pair of transistors; and
    a second write port having a third pair of bipolar transistors whose collectors are respectively connected to the transistors in said latch circuit, a third pair of bit lines respectively connected to the bases of said third pair of transistors, and a third word line connected to the emitters of said third pair of transistors.

* * * * *